United States Patent
Aigner et al.

(10) Patent No.: US 6,346,429 B1
(45) Date of Patent: Feb. 12, 2002

(54) METHOD FOR FABRICATING INTEGRATED SENSORS

(75) Inventors: Robert Aigner, München; Hergen Kapels, Neubiberg; Andreas Meckes, München; Klaus-Günter Oppermann, Holzkirchen, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/648,938

(22) Filed: Aug. 28, 2000

(30) Foreign Application Priority Data

Aug. 26, 1999 (DE) .......................................... 19940581

(51) Int. Cl.[7] .............................................. H01L 27/00
(52) U.S. Cl. ........................... 438/48; 438/51; 438/52; 438/53; 257/414; 257/419; 73/514.16
(58) Field of Search .............................. 438/48, 49, 50, 438/51, 52, 53; 257/414, 415, 416, 417, 418, 419; 73/514.16, 488, 514.01, 514.24

(56) References Cited

U.S. PATENT DOCUMENTS 5,798,283 A  *  8/1998  Montague et al. ............. 438/50
6,087,701 A  *  7/2000  Bergstrom et al. ........... 257/414

FOREIGN PATENT DOCUMENTS

| DE | 44 32 057 A1 | 3/1995 |
| DE | 44 14 938 A1 | 11/1995 |
| DE | 196 48 425 C1 | 1/1998 |
| DE | 198 59 627 A1 | 4/1999 |

OTHER PUBLICATIONS

"Silicon Sensors"(Middlehoeck et al.), Meas Science Technology 6, 1995, pp. 1641–1656.

"An Integrated Mass Flow Sensor with On–Chip CMOS Interface Circuitry", (Yoon), IEEE Transactions on Electron Devices, vol. 19, No. 6, Jun. 1992.

* cited by examiner

Primary Examiner—Richard Elms
Assistant Examiner—Beth E. Owens
(74) Attorney, Agent, or Firm—Herbert L. Lerner; Laurence A. Greenberg; Werner H. Stemer

(57) ABSTRACT

An integrated sensor is fabricated by etching recesses or depressions into the top side of a semiconductor body and by fabricating sensor components in the recesses or depressions. The sensor components are lowered in the recesses or depressions by approximately half of their height. Electronic components are fabricated in the remaining regions of the top side of the semiconductor body. The remaining regions may be covered with a protective layer if the recesses or depressions are fabricated after the electronic components.

10 Claims, 1 Drawing Sheet

METHOD FOR FABRICATING INTEGRATED SENSORS

BACKGROUND OF THE INVENTION

Field of the Invention

The invention relates to a method for fabricating integrated sensors.

Micromechanical sensors based on CMOS-compatible fabrication techniques often require, due to physical limitations and measurement technique limitations, large vertical-lateral aspect ratios in combination with large areas of the sensor elements. In order to produce these aspect ratios, large layer thicknesses typically of more than 1 μm are used, which are not fabricated in the course of a customary fabrication process for CMOS circuits. Therefore, if a micromechanical sensor is intended to be integrated with electronic components of a drive circuit, the problem arises of how to deal with the thick sensor layers within the CMOS process. After the patterning of such layers, considerable problems occur during subsequent phototechnology steps with regard to whole-area and uniform photoresist coating. The photoresist is applied using a so-called spin coating method, during which high steps on the processed surface prevent the photoresist from spreading uniformly when the photoresist, which is initially applied only in the center, is spun. As a result, it becomes necessary to use very large quantities of photoresist or to dispense with high steps in the surface topology.

An overview of the field of micromechanical sensors in the last 35 years is provided by S. Middelhoek et al. in "Review Article Silicon Sensors", Meas. Sci. Technol. 6 (1995), 1641–1658. By way of example, the fabrication of a micromechanical sensor on a substrate is described in which use is made of sacrificial layers that are deposited on the substrate and are removed again after that part of the micromechanical sensor which protrudes from the substrate has been produced. E. Yoon et al. describe in the article "An Integrated Mass Flow Sensor with On-Chip CMOS Interface Circuitry", IEEE, Transactions on Electron Devices, Vol. 39, No. 6, June 1992, 1376–1385, various types of micromechanical sensors and methods for fabricating them, including a pressure sensor. The substrate used in this case is processed on both sides.

German Patent Document DE 43 32 057 describes a method for fabricating a micromechanical sensor in which a body is formed with an insulating layer provided on a substrate and a monocrystalline silicon layer provided over the insulating layer, the silicon layer including a given doping. Trenches are etched in the silicon layer down to the surface of the insulating layer. The trench walls are doped. A transistor configuration is produced in a first region of the silicon layer. The insulating layer under a second region of the silicon layer is removed.

German Patent Document DE 44 14 968 describes a micromechanical component and a method for fabricating the component. An integrated circuit is produced in the substrate on which the component is produced. The metallization layer of the integrated circuit is simultaneously used as a part of the micromechanical component.

SUMMARY OF THE INVENTION

It is accordingly an object of the invention to provide a method for producing an integrated sensor which overcomes the above-mentioned disadvantages of the heretofore-known methods of this general type and which is suitable and practicable for integrating micromechanical sensors having a high aspect ratio with electronic components. In particular, it is an object to provide a method which is suitable for an implementation within a CMOS process.

With the foregoing and other objects in view there is provided, in accordance with the invention, a method for fabricating an integrated sensor, which includes the steps of:

fabricating, in a first step, on a top side of a semiconductor body, a structure of at least one electronic component and fabricating, in the semiconductor body, a recess, a depression or a region with a top region being lowered relative to an adjoining region by removing material of the semiconductor body;

depositing, in a second step, a layer in the recess, the depression, or the region with the top region lowered relative to the adjoining region, such that the layer projects above the top side of the semiconductor body in a vertical direction;

structuring, in a third step, the layer for fabricating a micromechanical component; and completing, in a fourth step, the at least one electronic component and the micromechanical component including electrical contacts and interconnects.

In accordance with another mode of the invention, in the first step, firstly the structure of the at least one electronic component is fabricated and the structure of the at least one electronic component is covered with a protective layer, and subsequently the recess, the depression or the region with the top region lowered relative to the adjoining region is fabricated by removing the material of the semiconductor body.

In accordance with yet another mode of the invention, in the first step, firstly, the recess, the depression or the region with the top region lowered relative to the adjoining region is fabricated by removing the material of the semiconductor body, and subsequently the structure of the at least one electronic component is fabricated.

In the method according to the invention, recesses or depressions are created in the substrate formed by a semiconductor body, with the result that sensor components which are fabricated therein are partially sunk or lowered. The recesses or depressions or regions in which the top side of the semiconductor body is lowered relative to an adjoining region are fabricated by removing semiconductor material from the semiconductor body, preferably by etching, before or after electronic components are fabricated in the remaining region of the top side of the semiconductor body. If the semiconductor material is not removed until after the electronic components have been fabricated, the latter are covered with a protective layer. A layer is deposited in the region of the recess or depression, the layer being provided for the patterning of the essential component parts of the sensor element and preferably being polysilicon. This layer projects above the top side of the component by between 20% and 80% of the layer thickness, preferably between 40% and 60% of the layer thickness, since, to enable simple fabrication, it is advantageous if the layer projects above the top side approximately by half.

Other features which are considered as characteristic for the invention are set forth in the appended claims.

Although the invention is illustrated and described herein as embodied in a method for fabricating integrated sensors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
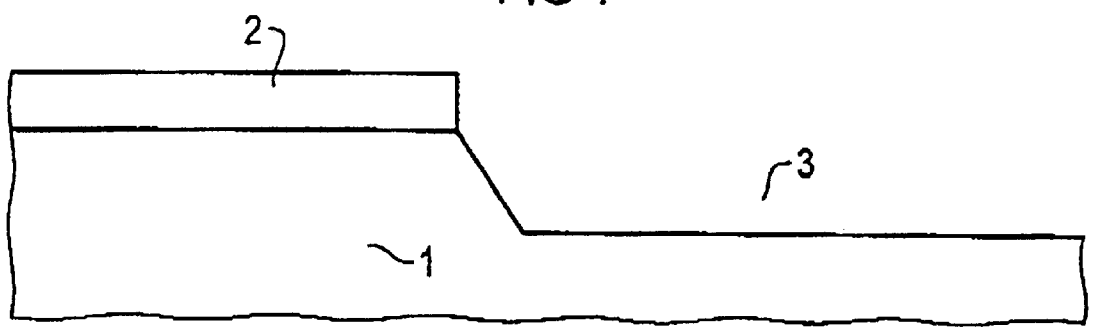
FIGS. 1 to 3 are diagrammatic, partial sectional views of a semiconductor chip illustrating different fabrication steps of an exemplary method according to the invention.

Referring now to the figures of the drawings in detail, there is illustrated an example in which first of all the recess and then the electronics are fabricated. FIG. 1 shows a cross section through a substrate formed by a semiconductor body 1. A top side of the semiconductor body is provided with a mask 2, so that the material under the mask remains in place during a subsequent etching process. Formed to the side of this is the recess 3, depression or areal region of whatever kind in which the top side of the semiconductor body is at a lower level compared with an adjacent region. This creates the precondition for integrating a sensor element having a high aspect ratio in the semiconductor chip without producing excessively high steps in the surface.

The etching process preferably proceeds in a time-controlled manner, i.e. the etching depth is determined by the etching duration and the course of the typical etching profile. It is possible to use both etching media that act anisotropically, in a manner dependent on crystal orientation and etching media that etch isotropically, e.g. etching solutions. The etching depth preferably amounts to about half the height of the structural elements that are to be provided there.

Figure 2:
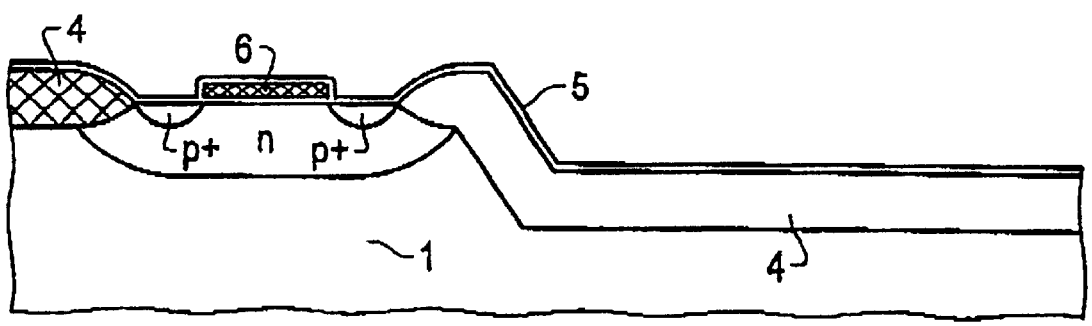

FIG. 2 shows the semiconductor body 1 in which doped regions are formed by diffusion or implantation after the removal of the mask 2, the regions forming a well n for the source and drain regions $p^{30}$ of a transistor in this example. The remaining regions of the relevant top side of the semiconductor body are electrically insulated with an insulation layer 4, which can be done by local thermal oxidation (LOCOS) if a silicon substrate is used. A dielectric layer 5, which may be an oxide, in particular $SiO_2$, is applied over the whole area. The dielectric layer serves as gate oxide in the region of the channel of the transistor and is provided there with a gate electrode 6, patterned from a first polysilicon deposition.

Figure 3:
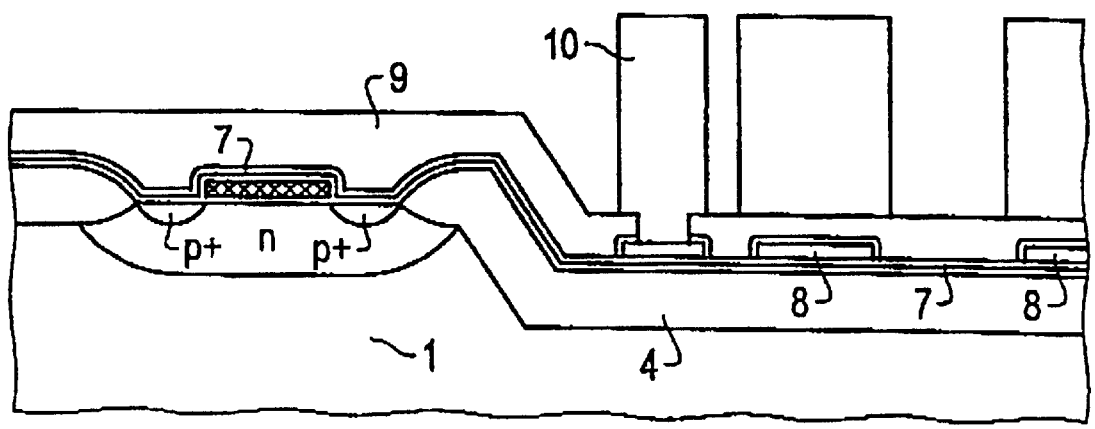

FIG. 3 shows the cross section from FIG. 2 after a protective layer 7, e.g. made of nitride, in particular $Si_3N_4$, has been applied over the whole area and patterned contact regions 8, patterned or structured e.g. from a second polysilicon deposition, and an auxiliary or sacrificial layer 9 have been fabricated in further deposition processes. As an alternative, the contact regions 8 may already be applied with the first polysilicon deposition and be patterned together with the gate electrode or gate electrodes 6. The auxiliary layer also serves as an additional protective layer in the region of the transistor. The auxiliary layer 9 has applied to it the thick layer 10, in particular as third polysilicon deposition, which is provided for the patterning of the sensor elements. This layer 10 projects above the top side of the semiconductor body in the region of the transistor, as can be can be seen in FIG. 3, only by about half. After the patterning of the layer 10 and, if appropriate, further method steps known per se for the fabrication of micromechanical sensors, the auxiliary layer 9 is removed at least in the region of the sensor in order to uncover the sensor elements in an intended manner.

Instead of the process sequence that has been described, firstly an electronic component may be fabricated in the as yet planar top side of the semiconductor body to the extent shown or to an extent that differs therefrom. Afterwards, the electronic part of the chip is covered, which can be done by using a mask, e.g. made of photoresist, or a correspondingly suitable, locally delimited layer. This covering is chosen in such a way that subsequent etching only removes semiconductor material in the region intended for the sensor element and leaves the electronic component intact. After the recess or depression in the semiconductor body has been fabricated by etching, the sensor element is fabricated there in the manner described using method steps that are known per se. For final completion, the covering of the electronic part is removed, if appropriate.

We claim:

1. A method for fabricating an integrated sensor, the method which comprises:

fabricating, in a first step, on a top side of a semiconductor body, a structure of at least one electronic component and fabricating, in the semiconductor body, one of a recess, a depression, and a region with a top region being lowered relative to an adjoining region by removing material of the semiconductor body;

depositing, in a second step, a layer in one of the recess, the depression, and the region with the top region lowered relative to the adjoining region, such that the layer projects above the top side of the semiconductor body in a vertical direction;

structuring, in a third step, the layer for fabricating a micromechanical component; and completing, in a fourth step, the at least one electronic component and the micromechanical component including electrical contacts and interconnects.

2. The method according to claim 1, which comprises fabricating, in the first step, firstly the structure of the at least one electronic component and covering the structure of the at least one electronic component with a protective layer, and subsequently fabricating, in the semiconductor body, the one of the recess, the depression, and the region with the top region lowered relative to the adjoining region, by removing the material of the semiconductor body.

3. The method according to claim 1, which comprises fabricating, in the first step, firstly, in the semiconductor body, the one of the recess, the depression, and the region with the top region lowered relative to the adjoining region, by removing the material of the semiconductor body, and subsequently fabricating the structure of the at least one electronic component.

4. The method according to claim 1, which comprises depositing the layer with a given layer thickness such that the layer projects above the top side of the semiconductor body in the vertical direction by 20% to 80% of the given layer thickness.

5. The method according to claim 2, which comprises depositing the layer with a given layer thickness such that the layer projects above the top side of the semiconductor body in the vertical direction by 20% to 80% of the given layer thickness.

6. The method according to claim 3, which comprises depositing the layer with a given layer thickness such that the layer projects above the top side of the semiconductor body in the vertical direction by 20% to 80% of the given layer thickness.

7. The method according to claim 1, which comprises depositing the layer with a given layer thickness such that the layer projects above the top side of the semiconductor body in the vertical direction by 40% to 60% of the given layer thickness.

8. The method according to claim 2, which comprises depositing the layer with a given layer thickness such that the layer projects above the top side of the semiconductor body in the vertical direction by 40% to 60% of the given layer thickness.

9. The method according to claim 3, which comprises depositing the layer with a given layer thickness such that the layer projects above the top side of the semiconductor body in the vertical direction by 40% to 60% of the given layer thickness.

10. The method according to claim 1, which comprises depositing the layer as a polysilicon layer.

* * * * *

UNITED STATES PATENT AND TRADEMARK OFFICE
CERTIFICATE OF CORRECTION

PATENT NO.    : 6,346,429 B1  Page 1 of 1
DATED         : February 12, 2002
INVENTOR(S)   : Robert Aigner et al.

It is certified that error appears in the above-identified patent and that said Letters Patent is hereby corrected as shown below:

<u>Title page,</u>
Item [56], should read as follows:

--             References Cited

U.S. PATENT DOCUMENTS
5,798,283 A * 8/1998    Montague et al. ......... 438/50
6,087,701 A * 7/2000    Bergstrom et al. ......... 257/414

FOREIGN PATENT DOCUMENTS

DE    43 32 057    A1    3/1995
DE    44 14 938    A1    11/1995
DE    196 48 425   C1    1/1998
DE    198 59 627   A1    4/1999          --

Signed and Sealed this

Twenty-seventh Day of August, 2002

Attest:

*Attesting Officer*

JAMES E. ROGAN
*Director of the United States Patent and Trademark Office*